US 11,300,881 B2

(12) United States Patent
Meli Thompson et al.

(10) Patent No.: US 11,300,881 B2
(45) Date of Patent: Apr. 12, 2022

(54) LINE BREAK REPAIRING LAYER FOR EXTREME ULTRAVIOLET PATTERNING STACKS

(71) Applicant: International Business Machines Corporation, Armonk, NY (US)

(72) Inventors: Luciana Meli Thompson, Albany, NY (US); Jing Guo, Niskayuna, NY (US); Nelson Felix, Slingerlands, NY (US); Ekmini Anuja De Silva, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 321 days.

(21) Appl. No.: 16/167,996

(22) Filed: Oct. 23, 2018

(65) Prior Publication Data

US 2020/0124972 A1 Apr. 23, 2020

(51) Int. Cl.
*G03F 7/40* (2006.01)
*G03F 7/00* (2006.01)
*G03F 7/20* (2006.01)
*H01L 21/311* (2006.01)
*H01L 21/027* (2006.01)

(52) U.S. Cl.
CPC ............. *G03F 7/40* (2013.01); *G03F 7/0035* (2013.01); *G03F 7/70466* (2013.01); *H01L 21/0274* (2013.01); *H01L 21/31138* (2013.01); *H01L 21/31144* (2013.01)

(58) Field of Classification Search
None
See application file for complete search history.

(56) References Cited

U.S. PATENT DOCUMENTS

| | | | |
|---|---|---|---|
| 6,753,117 B2 | 6/2004 | Lu | |
| 6,764,946 B1 | 7/2004 | Amblard | |
| 7,461,446 B2 | 12/2008 | McKean et al. | |
| 7,531,102 B2 | 5/2009 | Geng et al. | |
| 7,649,609 B2 | 1/2010 | Yoo et al. | |

(Continued)

OTHER PUBLICATIONS

Jing Guo et al., "Polymer brush as adhesion promoter for EUV patterning," Proc. of SPIE, vol. 10586, 105860I, 12 pp. 2018.

(Continued)

*Primary Examiner* — Kathleen Duda
(74) *Attorney, Agent, or Firm* — Fleit Intellectual Property Law; Thomas S. Grzesik

(57) ABSTRACT

A photolithography patterning stack and method for repairing defects in the stack. The stack includes an organic planarization layer, a hardmask layer, and a plurality of patterned photoresist lines in contact with the hardmask layer. A plurality of trenches is situated between the plurality of patterned photoresist lines. Each trench exposes a portion of the hardmask layer. A repairing layer is formed in contact with and only bonded to surfaces of the plurality of patterned photoresist lines. The method includes forming a photolithographic patterning stack. The stack includes at least a hardmask layer formed on one or more underlayers and a photoresist layer formed in contact with the hardmask layer. The photoresist layer is patterned into a plurality of patterned portions. A repairing layer is formed in contact with and only bonded to surfaces of each patterned portion of the plurality of portions.

20 Claims, 5 Drawing Sheets

(56) References Cited

U.S. PATENT DOCUMENTS

| | | |
|---|---|---|
| 8,652,768 B1 | 2/2014 | Huber et al. |
| 8,883,374 B2 | 11/2014 | Altamirano Sanchez |
| 9,159,561 B2 | 10/2015 | Chen et al. |
| 9,613,808 B1 * | 4/2017 | Ye .................. H01L 21/0337 |
| 2008/0113300 A2 * | 5/2008 | Choi ................ H01L 21/0273 |
| | | 430/311 |
| 2009/0148789 A1 | 6/2009 | Amara et al. |
| 2016/0124313 A1 * | 5/2016 | Hatakeyama ......... G03F 7/0397 |
| | | 430/325 |

OTHER PUBLICATIONS

Indira Seshadri et al., "Ultrathin EUV patterning stack using polymer brush as an adhesion promotion layer," Proc. of SPIE, vol. 10143, 101431D, 11 pp. 2017.

\* cited by examiner

LINE BREAK REPAIRING LAYER FOR EXTREME ULTRAVIOLET PATTERNING STACKS

BACKGROUND OF THE INVENTION

The present disclosure generally relates to the field of semiconductors, and more particularly relates to photolithography of semiconductor structures.

Ultraviolet (UV) radiation may be employed in photolithography to transfer a pattern onto an article to be processed such as a semiconductor wafer. As semiconductor devices continue to be reduced in scale, shorter wavelengths of radiation are preferred. As a result, techniques have been developed in which extreme ultraviolet (EUV) radiation can be used in the fabrication of semiconductor devices to form components and/or patterns at even smaller scales than more conventional UV photolithography allows. For example, EUV photolithography enables features with dimensions in the order of 20 nanometers (nm) or smaller. EUV radiation is often regarded as including wavelengths of from about 4 nm to about 40 nm. Although patterned feature dimensions have decreased the difficulty in achieving these smaller dimensions has increased. For example, multilayer lithography stacks typically utilized with EUV photolithography may cause defects in the patterned photoresist as devices become smaller and smaller. These defects include broken photoresist lines and microbridging, which can lead to device failures and decreased device performance.

SUMMARY OF THE INVENTION

In one embodiment, a method for repairing defects in a photolithographic patterning stack is disclosed. The method comprises forming a photolithographic patterning stack. The photolithographic patterning stack comprises at least a hardmask layer formed on one or more underlayers and a photoresist layer formed on and in contact with the hardmask layer. The photoresist layer is patterned into a plurality of patterned photoresist portions. A repairing layer is formed from functionalized material. The repairing layer is formed in contact with and only bonded to surfaces of each patterned portion of the plurality of portions.

In another embodiment, a method for repairing defects in a photolithographic patterning stack is disclosed. The method comprises forming a photolithographic patterning stack. The photolithographic patterning stack comprises at least a hardmask layer, on one or more underlayers formed on the hardmask layer, and a photoresist layer formed in contact with one of the one or more underlayers. The photoresist layer is patterned into a plurality of patterned photoresist portions. A repairing layer is formed from functionalized material. The repairing layer is formed in contact with and only bonded to surfaces of each patterned photoresist portion of the plurality of patterned photoresist portions.

In a further embodiment, a photolithography patterning stack is disclosed. The photolithography patterning stack comprises an organic planarization layer, a hardmask layer, and a plurality of patterned photoresist lines in contact with the hardmask layer. A plurality of trenches is situated between the plurality of patterned photoresist lines. Each trench of the plurality of trenches exposes a portion of the hardmask layer. A repairing layer is formed in contact with and only bonded to surfaces of the plurality of patterned photoresist lines.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

Figure 1:
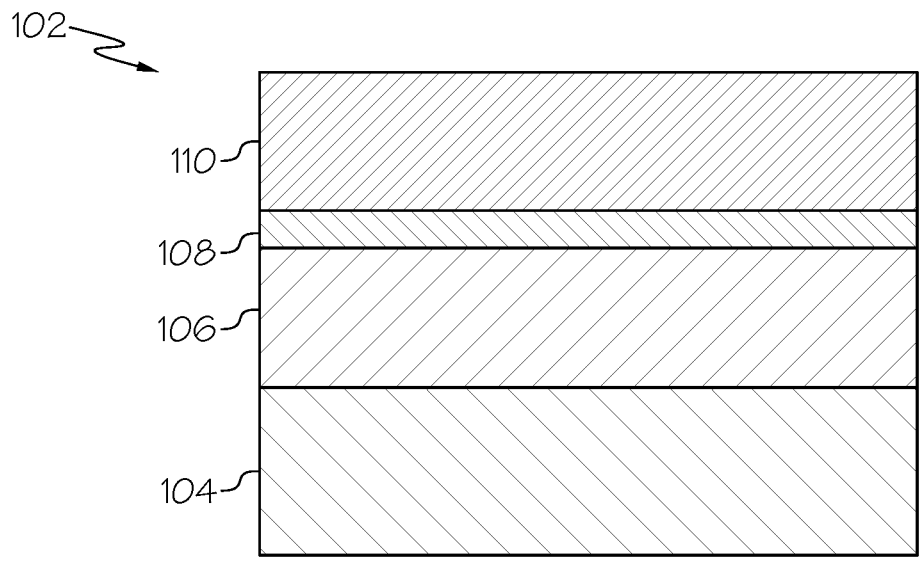
FIG. 1 is a cross-sectional view of one example of photolithographic patterning stack according to one embodiment of the present invention.

It is to be understood that the present disclosure will be described in terms of a given illustrative architecture; however, other architectures, structures, substrate materials, process features, and steps may be varied within the scope of the present disclosure.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present disclosure may include a design for an integrated circuit chip that may be created in a graphical computer programming language and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

FIGS. 1-5A illustrate various processes and structures for managing defects in EUV patterning stacks. FIG. 1 shows one example of an initial photolithography stack 102 applicable to one or more embodiments of the present invention. Photolithography patterning stacks are utilized by photolithography processes to transfer a defined pattern(s) to one or more underlying layers of a semiconductor device. The patterning stack 102 of FIG. 1 is formed on and in contact with a substrate 104. However, embodiments of the present invention are not limited to patterning stacks formed on a substrate as they may be formed on other patterning stacks, semiconductor features, other layers of the semiconductor device, and/or the like.

The patterning stack 102 may comprise an organic planarization layer (OPL) 106 formed in contact with the substrate 104; a hardmask layer 108 formed on and in contact with the OPL 106; and a photoresist layer 110 formed on and in contact with the hardmask layer 108. The OPL 106 may including a material(s) such as spin-on carbon (SOC), diamond-like carbon, polyarylene ether, polyimide, polymethyl methacrylate, polymethylisopropenyl ketone, photoresists, and/or the like. The OPL 106 may be formed utilizing any conventional deposition process including, for example, CVD, PVD, plasma enhanced chemical vapor deposition (PECVD), evaporation, spin coating, and dip coating. Chemical mechanical planarization (CMP) and/or grinding can be used to planarize the deposited OPL. The hardmask layer 108 may be a silicon-containing anti-reflective coating (SiARC) layer; a titanium-ARC; silicon substrates such as silicon dioxide (SiO2), silicon oxynitride (SiON), silicon nitride (SiN), silicon oxycarbide (SiOC)), amorphous silicon (a-Si), a metal oxide layer such as titanium dioxide (TiO2), a titanium-ARC, and/or the like; or any other hardmask layer suitable for an EUV patterning stack.

The hardmask layer 108 is formed by, for example, one or more processes including spin coating, sputtering, evaporation, CVD, PVD, ALD, and/or the like. The photoresist layer 110 may comprise a material that is sensitive to one or more types of radiation such as EUV light. The photoresist may be a copolymer of multiple monomers such as poly hydroxy styrene, poly acrylate, (monomers will have an acid labile protecting group) that also comprises photoacid in its composition. Upon exposure to acid the monomers may undergo acid catalyzed deprotection that enable solubility switching when developed in an aqueous base developer.

Figure 2:
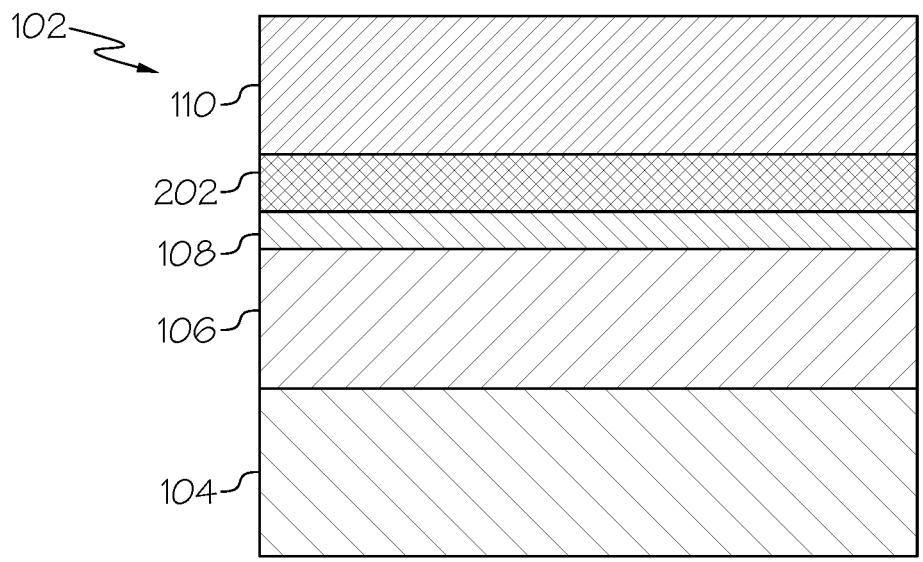
FIG. 2 is a cross-sectional view of another example of a photolithographic patterning stack according to one embodiment of the present invention.

In one embodiment, the patterning stack 102 may comprise an optional organic adhesion layer (OAL) layer 202 formed on and in contact with the hardmask layer 108, as shown in FIG. 2. In this embodiment, the photoresist layer 110 is formed on and in contact with the OAL layer 202. The OAL 110 provides resist adhesion and may include an organic bottom anti-reflective coating (BARC) material or other applicable material. The OAL 110 may be formed using a spin-coating technique or any other applicable technique. The patterning stack 102 may also comprise one or more additional underlayers not shown. It should be noted that embodiments of the present invention are not limited to patterning stacks comprising the layers shown in FIGS. 1 and 2, as embodiments are applicable to any patterning stack used for EUV photolithography that implements a hardmask layer.

Figure 3:
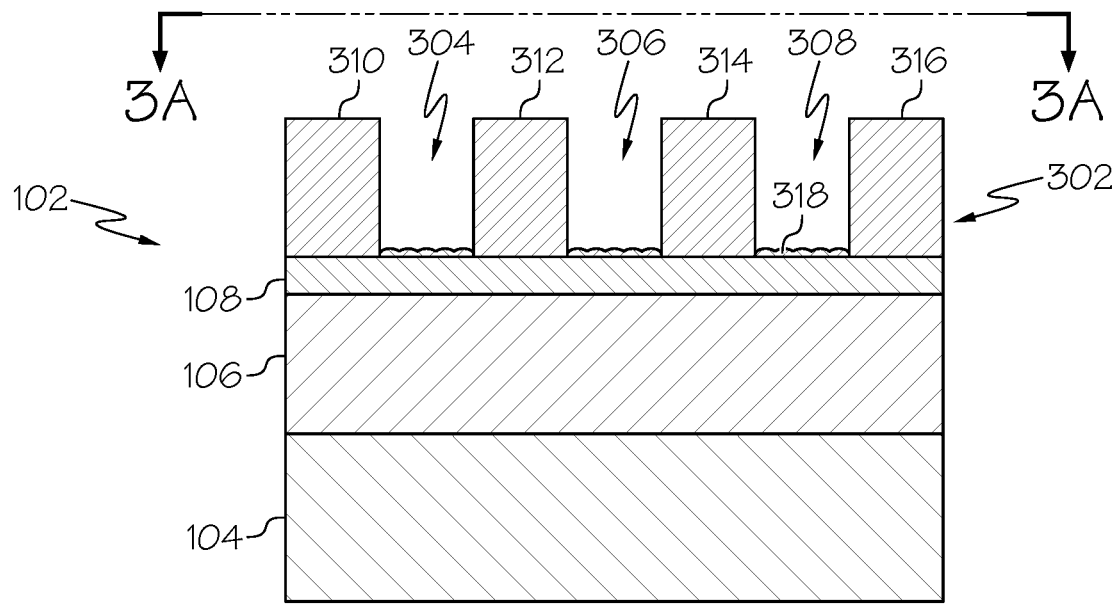
FIG. 3 is a cross-sectional view of the photolithographic patterning stack after a photoresist layer has been patterned according to one embodiment of the present invention.
Figure 3A:
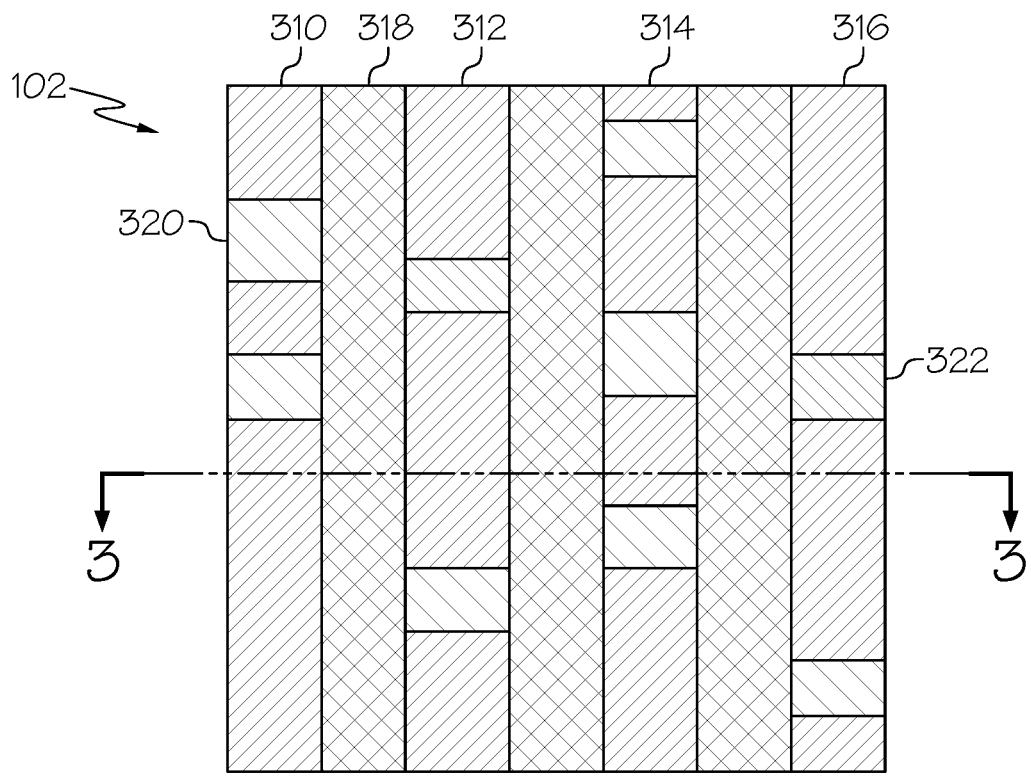
FIG. 3A is a plain view of the photolithographic patterning stack after the photoresist layer has been patterned according to one embodiment of the present invention.

A desired pattern may be transferred to one or more layers of the patterning stack 102, as shown in FIGS. 3 and 3A. In the example shown in FIGS. 3 and 3A an initial pattern 302 was transferred to the photoresist layer 110 such that portions of the photoresist layer were removed to form trenches 304 to 308 between portions photoresist layer 110. The photoresist layer 110 may be patterned using any suitable photolithography technique such as EUV. For example, in one embodiment, a photomask (not shown) is disposed over the photoresist layer 110. The photoresist layer 110 is then exposed to a radiation beam, and then hardened via a curing or baking process. Unexposed or exposed portions of the photoresist layer 110 may then be removed using a developer. The foregoing process results in the pattern 302 of "lines" 310 to 316 across the stack 102. The pattern 302 includes portions of the photoresist layer 110 in contact the hardmask layer 108 with openings/trenches 304 to 308 between these portions exposing the hardmask layer 108. If the optional OAL layer 202 is utilized, the pattern 302 includes portions of the photoresist layer 110 in contact the OAL layer 202 with openings/trenches between these portions exposing the OAL layer 202 (and possibly any additional underlayers). A separate selective etching process(es) may be used to transfer the pattern to the OAL 202 (and any additional underlayers).

As discussed above, the nature of the photoresist patterning process may result in non-continuous patterned lines referred to as "line breaks" of the photoresist. In addition, patterning of the photoresist layer 112 may also result in photoresist residue/scum remaining at the resist/hardmask interface or the resist/OAL interface. For example, FIGS. 3 and 3A show resist residue/scum 318 remaining in the trenches 304 to 308 on the surface of the underlying portions of the hardmask layer 108. The resist/scum 318 may be transferred to the underlying (including the substrate), causing microbridge or bridge defects that manifest as single line opens after metallization. FIG. 3A also shows notched regions 320, 322 within the patterned photoresist lines 310 to 316. The notched regions 320, 322 (represented as the different shaded areas within the lines 310-316) are referred to as line breaks since they are areas within the patterned photoresist lines 310 to 316 with non-continuous or reduced photoresist material.

Embodiments of the present invention overcome these problems by removing the photoresist residue/scum and repairing photoresist line breaks. For example, after the photoresist layer 110 has been patterned using a process such as single exposure EUV lithography a descumming process is used to remove residual resist material from the trenches 304 to 308. Descumming is a surface treatment process that removes organic material from a surface. In some embodiments, the descumming process may utilize oxygen plasma ashing to remove the residual photoresist from the underlying portions of the hardmask layer 108. Other chemistries such as HBr/O2, $CO_2/CH_4$, $CF_4$, and/or the like may also be used to remove the remove residual resist material as well. After the descumming process, the semiconductor device comprising the patterning stack 102 may then subjected to a resist hard bake process to further solidify and/or stabilize the patterned photoresist layers 310 to 316. The hard bake temperature may range, for example, between 150° C. to 300° C.

Figure 4:
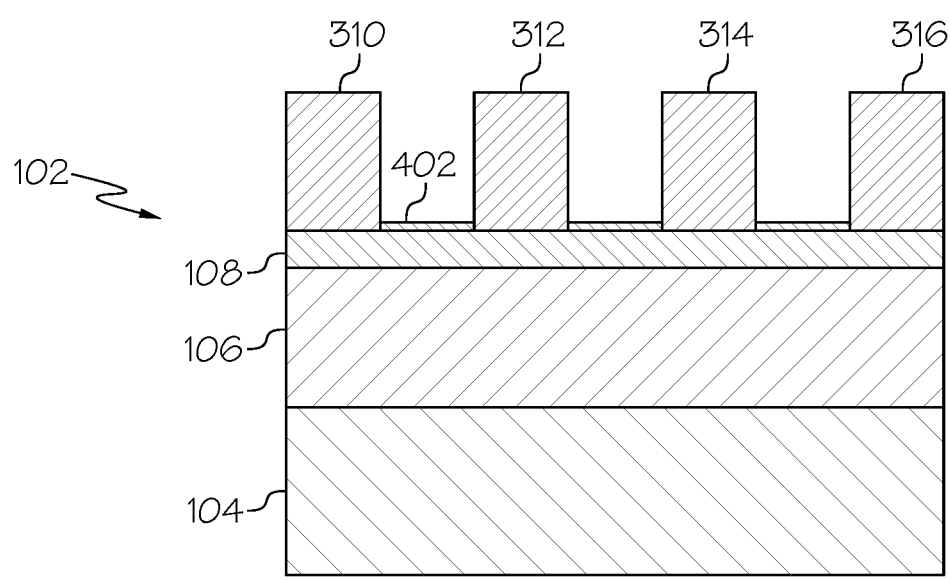
FIG. 4 is a cross-sectional view of the photolithographic patterning stack after trench areas have been functionalized according to one embodiment of the present invention.

FIG. 4 shows that exposed portions 402 of the hardmask layer 108 within the trenches may be functionalized after the descumming process. For example, an additional surface treatment process may be performed to functionalize the exposed portions 402 of the hardmask layer 108 and form either hydrogen (H) or methyl group (CH3) terminated portions of the hardmask layer 108 exposed within the patterned trenches 304 to 308. If an underlayer is utilized such as the OAL 202, the surface treatment process is performed after OAL 202 has been etched up to the hardmask layer 108. The surface treatment process(es) is utilized to distinguish selectivity for the subsequent grafting process discussed below. Examples of surface treatment processes include (but are not limited to) a dilute hydrofluoric acid (DHF) wet cleaning process, a silylation process, a hexamethyldisilazane (HMDS) priming process, and/or the like. In some embodiment, the surface treatment process may be selected depending on the hardmask layer 108. For example, if the hardmask is a-Si, then a DHF process will enable surface modification with hydrogen post DHF wets. If the hardmask is SiO2/SiON/SiN, these films can be functionalized with HMDS to enable CH3 terminated surfaces. It should be noted that although FIG. 4 shows the exposed portions of the hardmask layer 108 being functionalized across the entire width of the trenches other embodiments may functionalize a smaller area of the exposed portions of the hardmask layer 108.

After the exposed portions of the hardmask layer 108 (or OAL 202) have been functionalized (e.g., H or CH3 terminated), the semiconductor device may be subjected to an optional resist hard bake process to further solidify and/or stabilize the patterned photoresist lines 310 to 316. A functionalized line break repairing layer 502 (See FIGS. 5 and 5A) may then formed on the sidewalls and top surface of the patterned photoresist lines 310 to 316. In one embodiment, the line break repairing layer is formed utilizing a polymer brush system. A polymer brush is typically comprised of a homopolymer or random copolymer of two (A and B) or more components plus a functional group (C) at one end. Component A and component B may be used for surface energy control and end group C is for surface binding. More functional groups may be added onto the side chain for additional requirements when needed. One benefit of utilizing the polymer brush system is self-limiting grafting. Only one mono-layer of polymer will be grafted onto the surface because there is only one grafting group per chain. Process temperature, grafting density, kinetics, and surface selectivity may be optimized by choosing a proper grafting group. In addition, side groups may be used to control surface properties, etch behavior, n/k value, etc. The polymer brush may be a low molecular weight polymer, an oligomeric moiety, a self-assembled monolayer, and/or the like.

The polymer brush layer is formed in contact with sidewalls of the pattered photoresist lines 310 to 316; the top surface of the photoresist lines 310 to 316; and the top surface of the exposed portions of the hardmask layer 108 within the trenches 304 to 308. In one embodiment, the polymer brush layer may comprise an amine, hydroxy, thiol, carboxylic acid, alkyl/aryl amide, alkyl/aryl halide, or epoxide group at the end. One example of a polymer brush is a polystyrene polymer brush <5 k MW with hydroxyl terminated end group. The polymer brush may be applied to the structure by spin coating, or other suitable techniques including but not limited to coating, spraying, dip coating, etc. The coating process should allow complete coverage of the targeted surface and result in a film thickness greater than the target grafted thickness.

A baking or anneal process is then performed to graft a portion of the polymer brush layer at the respective interfaces between the polymer brush layer and surfaces of the patterned photoresist lines 310 to 316. The annealing process may be carried out in air, vacuum, or inert atmospheres at a temperature from about 28 C to about 350 C for approximately 1 to 5 min. The temperature depends on the molecular weight and chemistry of the polymer used. The maximum temperature may also be limited by the activation temperature of cross-linking group present in the brush. In other embodiments, the brush comprises a low temperature grating group such as (but not limited to) amine, which can graft at room temperature (e.g., 20° C. to 27° C.). In this embodiment, the baking or anneal process is not required.

Figure 5:
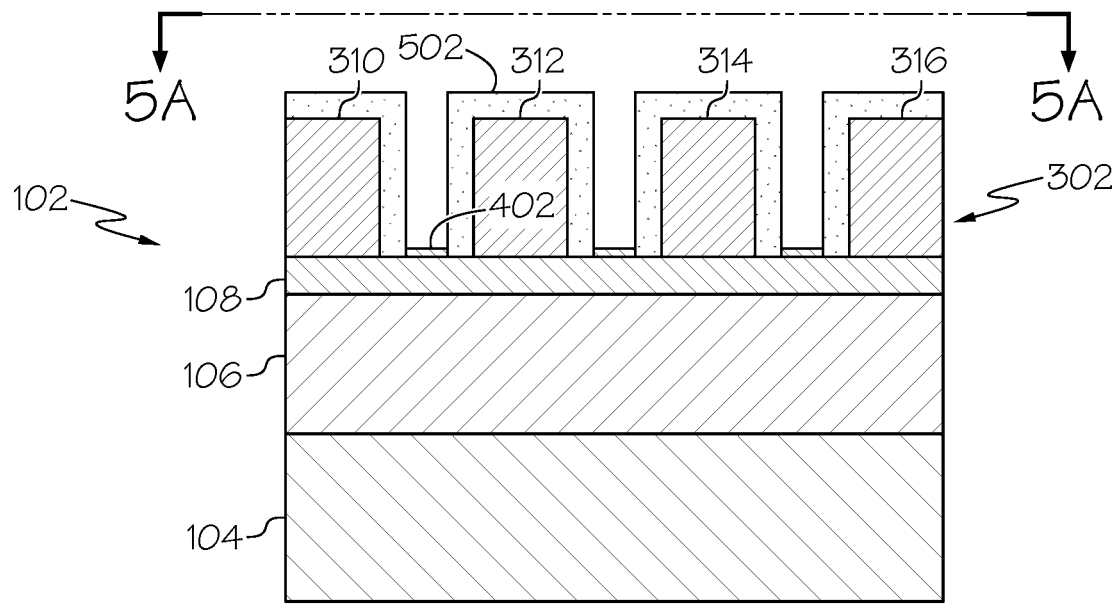
FIG. 5 is a cross-sectional view of the photolithographic patterning stack after a repairing layer has been formed in contact with surfaces of the photolithographic patterning stack according to one embodiment of the present invention.
Figure 5A:
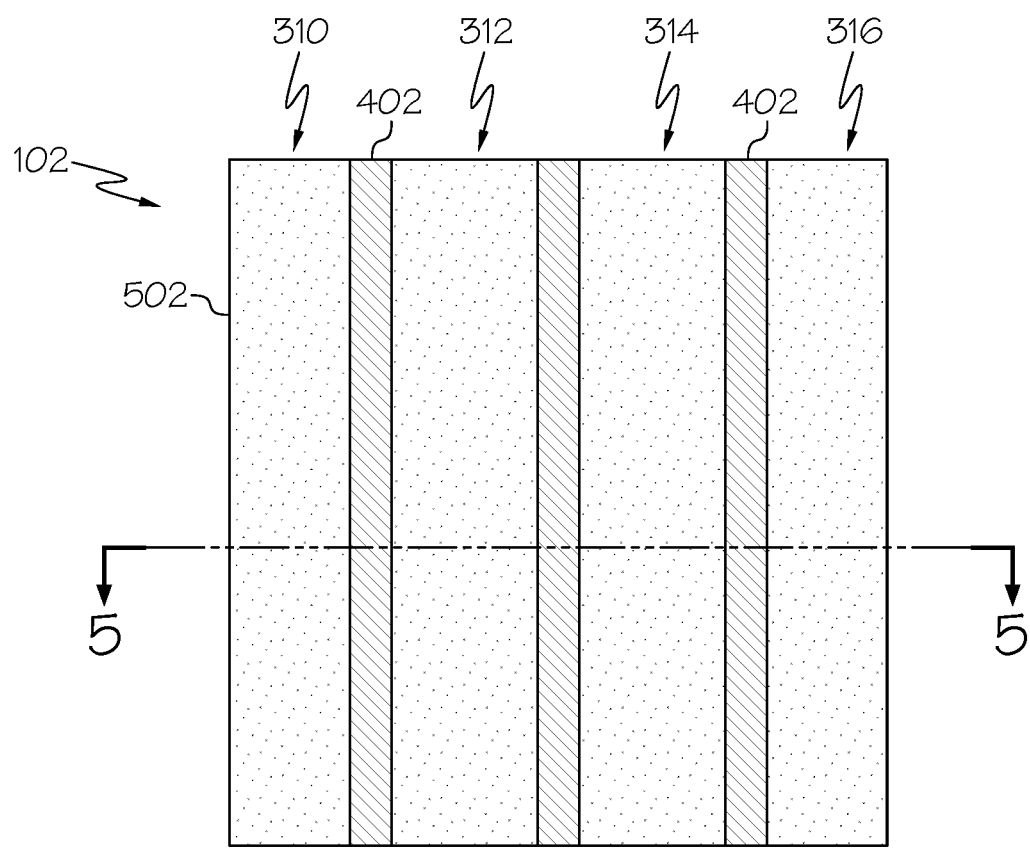
FIG. 5A is a plain view of the photolithographic patterning stack after the repairing layer has been formed in contact with surfaces of the photolithographic patterning stack according to one embodiment of the present invention.

The grafting process forms a monolayer 502 of the polymer brush 402 as shown in FIGS. 5 and 5A. As discussed above, the treatment process performed on the exposed portions of the hardmask layer 108 modify these portions such that they are H or CH3 terminated. In one embodiment, the end group of the polymer brush is selective such that the polymer brush only binds to the photoresist material and does not graft to the H or CH3 terminated portions of the hardmask layer 108. Therefore, the monolayer 502 is formed in contact with and only bonded to the patterned photoresist lines 310 to 316 and is not bound to exposed portions 402 of the hardmask layer 108 that were functionalized. In one embodiment, the monolayer 502 has a thickness of 2 nm to 10 nm. The thickness of the monolayer 502 is controlled by the chemistry, molecular weight, and grafting density of the polymer brush. In some embodiments, the brush layer may be comprised of hydroxyl terminated polystyrene with molecular weight ranges from about 3,000 g/mol to about 50,000 g/mol. For a polystyrene polymer with molecular weight of approximately 10,000 g/mol, the thickness of the brush will be approximately 5 nm at saturated grafting density.

The remaining brush layer is given a solvent rinse to remove any excess polymer brush layer that was not cross-linked or grafted to a surface. Examples of solvents for dissolving the brush layer alone or in a composition with other components include (but are not limited to) propylene glycol monomethyl ether acetate (PGMEA), ethoxyethyl propionate, anisole, ethyl lactate, 2-heptanone, cyclohexanone, amyl acetate, n-butyl acetate, n-amyl ketone (MAK), gamma-butyrolactone (GBL), toluene, and the like. The rinse material is chosen as to be compatible with the resist that has undergone a hard bake and therefore not affected by the solvent. Only the monolayer 502 of the brush material remains after the rinse, with the monolayer 502 being formed only in contact with and bonded to the surfaces of the patterned photoresist lines 310 to 316. In some embodiments, areas of the exposed portions of the hardmask layer 108 near the inner sidewalls of the patterned photoresist lines 310 to 316 may not have been functionalized. In these embodiments, the monolayer 502 may be formed in contact with and bonded to these areas of the hardmask layer 108 as well.

FIG. 5A further shows that the notched regions 320, 322 within the patterned photoresist lines 310 to 316 have been filled with the monolayer 502 (also referred to herein as "line break repairing layer 502" of "functionalized repairing layer 502"). In some embodiments, the top surface of the monolayer 502 may be substantially co-planar across the patterned photoresist lines 310 to 316, where other embodiments may have overburden areas of the monolayer 502 such that the top surface of the monolayer 502 is not co-planar across the patterned photoresist lines 310 to 316. The overburden areas help to increase the thickness in regions where the patterned photoresist lines would have broken or are almost broken.

One or more processes are then performed to cross-link each the line break repairing layers 502. In one embodiment, the polymer brush (and hence the repairing layers 502) comprises thermally-activated cross-linkable groups. These cross-linkable groups may be incorporated into the grafting polymer to form a network that makes the repairing layers 502 robust for further processing. In some embodiments, the polymer brush (and hence the spacer brushes repairing layers 502) comprises a high-temperature cross-linking group such as (but not limited to) benzocyclobutene (BCB) with crosslinking temperature of approximately 200° C. or above. The high-temperature characteristic of the cross-linking group prevents activation of the cross-linker during the grafting process. In an embodiment where the spacer brushes repairing layers 502 comprise thermally-activated cross-linkable groups, a thermal anneal may be performed at an elevated temperature such as 200° C. to 400° C. for a duration of 30 seconds to 5 minutes to promote cross-linking. It should be noted that other temperature and time ranges are applicable as well. In another embodiment, the cross-linkable group(s) is deep ultraviolet (DUV) activated and comprises one or more of a variety of DUV activated cross-linkable groups such as (but not limited to) epoxy, acrylate, and azide groups. In yet another embodiment, styrene group on the polymer main chain may also be used as a crosslinker if a proper wavelength of DUV is chosen. The polymer brush having DUV-activated crosslinkable groups is exposed to DUV radiations of wavelengths from 150 nm to 300 nm for a length of time that is dependent on the dose used. For example, the brush could be crosslinked for 1 to 2 min with a 250 mJ/cm2 dose of radiation with a wavelength of 172 nm. After the line break repairing layers 502 have been formed, conventional operations may be performed to transfer the photoresist line patterns to one or more underlying layers of the stack 102 and/or underlying layers of the semiconductor device.

Figure 6:
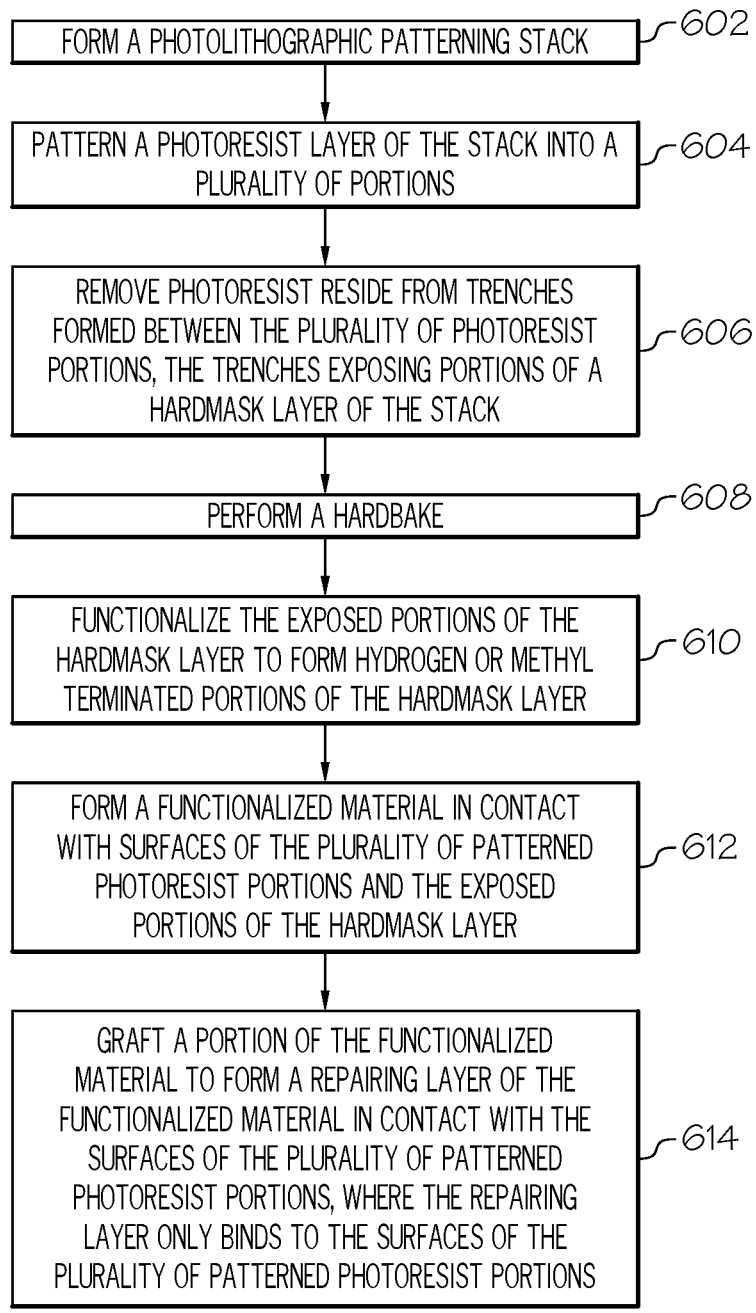
FIG. 6 is an operational flow diagram illustrating one example of a process for repairing defects in a photolithographic patterning stack according to one embodiment of the present invention.

FIG. 6 is an operational flow diagram illustrating one example of a process for repairing defects in a photolithographic patterning stack. It should be noted that each of the steps shown in FIG. 6 has been discussed in greater detail above with respect to FIGS. 1 to 5A. A photolithographic patterning stack, at step 602, is formed. The photolithographic patterning stack comprises at least a hardmask layer formed on one or more underlayers and a photoresist layer formed on and in contact with the hardmask layer. In another embodiment, the stack comprises least a hardmask layer, on one or more underlayers formed on the hardmask layer, and a photoresist layer formed in contact with one of the one or more underlayers. The photoresist layer, at step 604, is patterned into a plurality of patterned portions. The patterning forms a plurality of trenches separating the plurality of patterned portions.

Photoresist residue within the plurality of trenches, at step 606, is removed. The removing exposes a portion of the hardmask layer (or the underlayer) within each trench of the plurality of trenches. A resist hard bake, at step 608, is performed. The exposed portions of the hardmask layer (or the underlayer), at step 610, are functionalized to form hydrogen or methyl terminated portions of the hardmask layer. A functionalized material, at step 612, is formed in contact with surfaces of the plurality of patterned photoresist portions and the exposed portions of the hardmask layer (or the underlayer). Graft a portion of the functionalized material, at step 614, to form a repairing layer of the functionalized material on and in contact with the surfaces of the plurality of patterned photoresist portions, where the repairing layer only binds to the surfaces of the plurality of patterned photoresist portions.

Although specific embodiments have been disclosed, those having ordinary skill in the art will understand that changes can be made to the specific embodiments without departing from the spirit and scope of the disclosure. The scope of the disclosure is not to be restricted, therefore, to the specific embodiments, and it is intended that the appended claims cover any and all such applications, modifications, and embodiments within the scope of the present disclosure.

It should be noted that some features of the present disclosure may be used in one embodiment thereof without use of other features of the present disclosure. As such, the foregoing description should be considered as merely illustrative of the principles, teachings, examples, and exemplary embodiments of the present disclosure, and not a limitation thereof.

Also note that these embodiments are only examples of the many advantageous uses of the innovative teachings herein. In general, statements made in the specification of the present application do not necessarily limit any of the various claimed disclosures. Moreover, some statements may apply to some inventive features but not to others.

What is claimed is:
1. A method for repairing defects in a photolithographic patterning stack, the method comprising at least:
forming a photolithographic patterning stack comprising at least a hardmask layer formed on one or more underlayers and a photoresist layer formed on and in contact with the hardmask layer;
patterning the photoresist layer into a plurality of patterned portions; and
forming a repairing layer from functionalized material, the repairing layer being formed in contact with and only binding to surfaces of each patterned portion of the plurality of patterned portions and a non-functionalized surface of one or more portions of the hard mask layer exposed by at least one notched region of one or more patterned portions of the plurality of patterned portions.

2. The method of claim 1, wherein patterning the photoresist layer into the plurality of patterned portions comprises utilizing an Extreme Ultraviolet lithography process.

3. The method of claim 1, wherein patterning the photoresist layer into the plurality of patterned portions forms a plurality of trenches separating the plurality of patterned portions.

4. The method of claim 3, further comprising:
removing photoresist residue within the plurality of trenches, wherein the removing exposes a portion of the hardmask layer within each trench of the plurality of trenches.

5. The method of claim 4, further comprising:
after the photoresist residue has been removed, modifying the exposed portion of the hardmask layer within each trench of the plurality of trenches, the modifying changing a functionality of the exposed portion of the hardmask layer within each trench such that the functionalized material does not bind to the exposed portion of the hardmask layer within each trench.

6. The method of claim 5, wherein modifying the exposed portion of the hardmask layer within each trench of the plurality of trenches forms one of a hydrogen or methyl terminated portion of the hardmask layer.

7. The method of claim 5, wherein the exposed portion of the hardmask layer within each trench of the plurality of trenches is modified utilizing one of a dilute hydrofluoric acid wet cleaning process, a silylation process, or a hexamethyldisilazane priming process.

8. The method of claim 1, wherein forming the repairing layer comprises:
depositing the functionalized material in contact with surfaces of the plurality of patterned portions and a plurality of portions of the hardmask layer exposed within a plurality of trenches situated between the plurality of patterned portions.

9. The method of claim 8, wherein forming the repairing layer further comprises:
grafting a portion of the functionalized material to form a monolayer of functionalized material in contact with and only binding to the surfaces of each patterned portion of the plurality of portions, wherein the functionalized material does not graft to the plurality of portions of the hardmask layer.

10. The method of claim 8, wherein the functionalized material is functionalized with one of:
an amine end group;
a hydroxy end group;
a thiol end group;
a carboxylic acid end group;
an alkyl/aryl amide end group;
an alkyl/aryl halide end group; or
an epoxide end group.

11. The method of claim 8, wherein the functionalized material comprises one of:
a low molecular weight polymer;
an oligomeric moiety; or
a self-assembled monolayer.

12. A method for repairing defects in a photolithographic patterning stack, the method comprising at least:
forming a photolithographic patterning stack comprising at least a hardmask layer, one or more underlayers formed on the hardmask layer, and a photoresist layer formed in contact with one underlayer of the one or more underlayers;
patterning the photoresist layer into a plurality of patterned portions;
removing photoresist residue within a plurality of trenches separating the plurality of patterned portions, wherein the removing exposes a portion of the one underlayer within each trench of the plurality of trenches; and
after the photoresist residue has been removed, performing a surface treatment process on the exposed portion of the one underlayer within each trench of the plurality of trenches, the surface treatment process distinguishing selectivity for subsequent formation of a repairing layer; and
forming the repairing layer from functionalized material, the repairing layer being formed in contact with and only binding to surfaces of each patterned portion of the plurality of patterned portions.

13. The method of claim 12, wherein patterning the photoresist layer into the plurality of patterned portions forms the plurality of trenches separating the plurality of patterned portions.

14. The method of claim 13, wherein performing the surface treatment process comprises:
modifying the exposed portion of the one underlayer within each trench of the plurality of trenches, the modifying changing a functionality of the exposed portion of the one underlayer within each trench such that the functionalized material does not bind to the exposed portion of the one underlayer within each trench.

15. The method of claim 14 wherein modifying the exposed portion of the one underlayer within each trench of the plurality of trenches forms one of a hydrogen or methyl terminated portion of the hardmask layer.

16. The method of claim 14, wherein the exposed portion of the one underlayer within each trench of the plurality of trenches is modified utilizing one of a dilute hydrofluoric acid wet cleaning process, a silylation process, or a hexamethyldisilazane priming process.

17. The method of claim 12, wherein forming the repairing layer comprises:
depositing the functionalized material in contact with surfaces of the plurality of patterned portions and a plurality of portions of the one underlayer exposed within a plurality of trenches situated between the plurality of patterned portions; and
grafting a portion of the functionalized material to form a monolayer of functionalized material in contact with and only binding to the surfaces of each patterned portion of the plurality of portions, wherein a functionalization of the functionalized material prevents the functionalized material from grating to the plurality of portions of the one underlayer.

18. The method of claim 17, wherein the functionalized material is functionalized with one of:
an amine end group;
a hydroxy end group;
a thiol end group;
a carboxylic acid end group;
an alkyl/aryl amide end group;
an alkyl/aryl halide end group; or
an epoxide end group.

19. The method of claim 17, wherein the functionalized material comprises one of:

a low molecular weight polymer;
an oligomeric moiety; or
a self-assembled monolayer.

20. The method of claim 12, wherein repairing layer further comprises:
   forming overburden areas of the repairing layer to increase the thickness in at least one compromised region of one or more patterned portions of the plurality of patterned portions.

* * * * *